(12) United States Patent
Perrot et al.

(10) Patent No.: US 8,812,655 B2
(45) Date of Patent: Aug. 19, 2014

(54) DETERMINING DEADLOCK-CRITICAL RELATIONS BETWEEN COMPONENTS OF A VEHICLE SYSTEM

(75) Inventors: Kai Perrot, Eberdingen (DE); Hans Hillner, Ludwigsburg (DE); Reinhard Keil, Schwieberdingen (DE)

(73) Assignee: Robert Bosch GmbH, Stuttgart (DE)

( * ) Notice: Subject to any disclaimer, the term of this patent is extended or adjusted under 35 U.S.C. 154(b) by 490 days.

(21) Appl. No.: 12/916,876

(22) Filed: Nov. 1, 2010

(65) Prior Publication Data

US 2011/0153813 A1 Jun. 23, 2011

(30) Foreign Application Priority Data

Nov. 2, 2009 (DE) .......................... 10 2009 046 282

(51) Int. Cl.
*G06F 15/173* (2006.01)
(52) U.S. Cl.
USPC ............ 709/224; 709/232; 709/201; 709/203
(58) Field of Classification Search
USPC .................................. 709/223, 224, 201, 203
See application file for complete search history.

(56) References Cited

U.S. PATENT DOCUMENTS 5,592,610 A * 1/1997 Chittor ..................... 714/4.12
5,832,484 A * 11/1998 Sankaran et al. ............... 1/1

FOREIGN PATENT DOCUMENTS

DE 197 23 079 11/1998
JP 63-103934 5/1988

* cited by examiner

*Primary Examiner* — Lan-Dai T Truong
(74) *Attorney, Agent, or Firm* — Kenyon & Kenyon LLP

(57) ABSTRACT

In a method for determining deadlock-critical relations between networked components of a vehicle system, a graph, which at least partially represents the inhibit relations defined in the vehicle system and which has nodes and edges, is used, in which a classification takes place of at least a portion of the edges on the basis of the properties of the edges and the nodes connected by the edges, a prioritization of the edges on the basis of the classification takes place, and a determination of shortest deadlock-critical cycles for all nodes and at least some of the edges on the basis of the prioritization is implemented.

17 Claims, 6 Drawing Sheets z.B. DFC_1 −( Defect )→ DFC_2

DFC_1                     DFC_2

Simple      ⟶   Simple
Simple Temporary  ⟶   Simple Temporary
Hard         ⟶   Hard
Potential     ⟶   Potential DFC_1 −( NotTested )→ DFC_2

DFC_1                     DFC_2

Simple      ⟶   Simple
Simple Temporary  ⟶   Simple Temporary
Hard         ⟶   Hard
Potential     ⟶   Potential

DETERMINING DEADLOCK-CRITICAL RELATIONS BETWEEN COMPONENTS OF A VEHICLE SYSTEM

CROSS-REFERENCE TO RELATED APPLICATIONS

The present application claims priority to Application No. 10 2009 046 282.1, filed in the Federal Republic of Germany on Nov. 2, 2009, which is expressly incorporated herein in its entirety by reference thereto.

FIELD OF THE INVENTION

The present invention relates to a method for determining deadlock-critical relations between components of a vehicle system, and to a device which is arranged for implementing the method.

BACKGROUND INFORMATION

Modern vehicle systems are made up of a multitude of system components that are networked and interact with each other. Due to safety requirements, for example, inhibit relations are frequently defined between certain vehicle components. The inhibit relations are activated and deactivated as a function of diagnosis states.

That is to say, depending on the states of individual diagnoses, certain functionalities may not become active in the vehicle due to the inhibition. According to certain conventional systems, such inhibit relations in vehicle systems are controlled via a DSM (Diagnostic System Manager) with the aid of a so-called DINH (Diagnostic Inhibit Handler). Depending on the particular state of a DFC (Diagnostic Fault Check), so-called FIDs (function identifiers) are enabled or inhibited. In view of the multitude of components in modern vehicle systems, which, furthermore, feature a high degree of cross-linking, it may happen that corresponding functionalities lead to a cyclical chain of inhibitions, so that none of the FIDs in a cycle is enabled anymore. Such a state is usually referred to as deadlock.

As a rule, a deadlock can no longer be reversed and must consequently be prevented in advance by an appropriate arrangement of the associated inhibit relations.

Therefore, an aspect of the so-called DSM plausibilization that is involved in this context to detect critical inhibit relations and to identify which ones of them could potentially lead to a deadlock. Hereinafter, such critical inhibit relations are referred to as "deadlock-critical".

For illustration purposes, FIG. 1 shows a cycle denoted by 100 as a whole, which includes a deadlock. The cycle is made up of previously elucidated DFCs, denoted by DFC_1 and DFC_2 in this instance, and also of the corresponding FID_1 and FID_2. Here, the FIDs, indicated by arrows 110 and 111, calculate states of the associated DFCs. The DFCs, illustrated by arrows 120 and 121, cause a release or inhibition of the individually post-connected FIDs. As symbolized by the double-crossed arrows 120, 121 in FIG. 1, the particular DFCs are in an inhibit state. In the state of FIG. 1, both DFC_1 and DFC_2 wait for a release by the associated FIDs, which does not take place, however, because the FID in turn is inhibited by the DFCs immediately upstream.

For the purpose of determining deadlock-critical relations between components of a vehicle system, it is conventional to arrange a graph which reproduces the vehicle system and has nodes and edges in accordance with conventional graph-theory rules, the nodes and edges representing the components and their relations.

According to certain conventional systems, all paths in the graph that connect the system components or the nodes by which they are symbolized, are searched in order to discover deadlock-critical cycles. Corresponding methods are described in German Published Patent Application No. 197 230 079, U.S. Pat. No. 6,223,200, U.S. Pat. No. 5,832,484, and Japanese Published Patent Application No. 63-103934, for example.

However, conventional methods have the disadvantage that, because of the large number of paths to be checked, the run time of a corresponding algorithm is unacceptably long (several days). In contrast, an alternative according to which only the shortest paths in a corresponding graph would be checked would have the result that perhaps a non-critical (shorter) cycle is found and output for a node despite the fact that a critical (longer) cycle exists in addition. The critical cycle would therefore not be found and in practice could cause a deadlock.

Therefore, it is desirable to provide an optimized method for determining deadlock-critical relations, which has acceptable run times and which makes it possible to determine the largest and most complete number of deadlock-critical relations possible, critical cycles being found before less critical cycles.

SUMMARY

According to example embodiments of the present invention, a method for determining deadlock-critical relations between components of a vehicle system, and an associated device are provided.

Example embodiments of the present invention provide for classifying the edges of a graph, which represents the inhibit relations defined in the vehicle system on the basis of the properties of the edges and the nodes that are connecting them, of prioritizing at least a few of the edges on the basis of the classification, and of determining deadlock-critical cycles for at least a few of these edges on the basis of the prioritization. These cycles can then be traversed and deadlock-critical relations subsequently be defined on the basis of the traversal.

The approach according to example embodiments of the present invention is based cycles of different classes existing in a corresponding graph, which have different weights or criticality. As mentioned earlier, a search of all cycles is impossible for run time-related reasons. Against this background, example embodiments of the present invention thus provide an efficient rule that ensures that, provided cycles having the highest criticality exist, at least one of these cycles will be discovered.

This approach is based on reducing the deadlock search to the problem of the shortest cycles. A shortest cycle corresponds to the shortest path from one node back to itself via at least one edge.

For example, the approach according to example embodiments of the present invention includes the feature that each node is assigned an n-tupel, the elements of the n-tupels indicating corresponding criticality stages and n thus corresponding to a number of criticality stages. Each node is thus "split up" into n elements.

Following the split-up, nodes that are connected by an edge have connections between certain elements of the involved n-tupels. If no transition between criticality stages takes place between the particular nodes connected by the edge, then the edge connects tupel elements of the same criticality stage.

Vice versa, the edge connects different criticality stages when a transition takes place. According to example embodiments of the present invention, transitions in criticality stages are defined based on the properties of connected nodes and the properties of the edge connecting them.

The assignment of the n-tupels to the nodes corresponds to splitting the graph into n levels. If a transition from one level to the other occurs within a cycle, then the cycle includes a criticality stage transition. According to the transitions defined by associated edges, specific inhibit relations or edges, and thus also cycles, are able to be prioritized for a subsequent search for deadlock-critical relations. In an advantageous manner, to find one of the critical cycles with certainty, it is therefore no longer necessary to search all paths but only those paths that have correspondingly classified transitions and that have been prioritized according to these transitions. Such a prioritization therefore makes it possible to search for shortest paths or cycles, while it is ensured nevertheless that one of the cycles for each criticality stage (provided at least one of them exists) is found for each node.

Within and between the levels defined by the n-tupels, it is therefore possible to search for different classes of cycles based on the criticality prioritization implemented in advance.

As a result, example embodiments of the present invention provide a significant acceleration of the determination of deadlock-critical relations while simultaneously identifying the critical cycles.

In an especially advantageous manner, a finite state machine is used within the framework of example embodiments of the present invention, which has a number of states that correspond to the criticality stages. A state transition of the finite state machine corresponds to (i) a transition between criticality stages between edges, and thus simultaneously to (ii) a connection between tupel elements of different criticality stages, and consequently also (iii) a transition between graph levels defined by the n tupel elements.

Further features and aspects of example embodiments of the present invention are described in more detail below with reference to the appended Figures.

DETAILED DESCRIPTION

Figure 1:
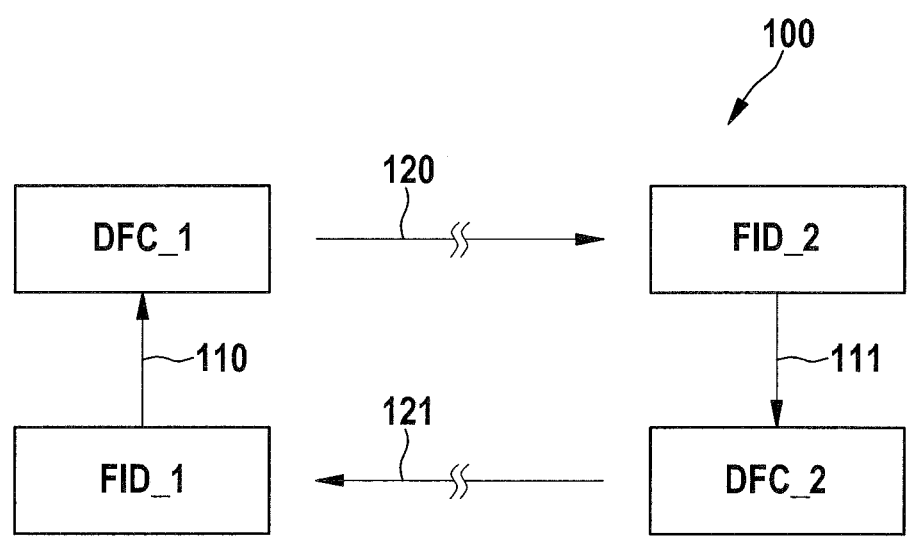
FIG. 1 is a graph, which represents interrelated components of a vehicle system, the graph depicting a deadlock state.

The attached figures are explained in the following text using the example of a vehicle system made up of system components and realized in a vehicle.

In such vehicle systems, cyclical inhibit relations are able to be sorted as follows, in descending order of criticality:
1. "Hard" deadlock (irreversible deadlock). Such a deadlock is no longer reversible by system functions and should therefore be avoided under all circumstances.
2. "Potential" deadlock. Such a deadlock may arise and possibly be resolved again; however, given the information available in this regard, no more specific statement may be made in this regard a priori. Since such a deadlock is able to be resolved only under specific circumstances, it should likewise be avoided.
3. "Temporary" deadlock. Such a deadlock is resolved only at the start of the next drive. Thus, it may be considered less critical.
4. "Simple" cycle. This is a cyclical inhibit relation, which can never lead to a deadlock since at least one of the inhibit relations in the cycle is not active, or cannot be active, at any one point in time. By definition, however, a deadlock may occur only when all system components are inhibited in the cycle.

Therefore, an aspect of the method according to example embodiments of the present invention is the output of the previously mentioned classes 1 and 2 ("Hard" and "Potential") as error message or as warning since either deadlocks that are produced are unable to be resolved again or a non-resolvable deadlock will possibly be created.

The influence variables on which the classification of a cyclical inhibit relation into one of the four mentioned classes depends may be differentiated via variables that act on the edges of a corresponding graph, and via variables that act on the associated nodes. The terminology is based on the terms used in typical vehicle systems.

Influence variables acting on edges:
"Inhibit" with "NotTested". This is an inhibit relation that remains active until the feature "NotTested" occurs. "NotTested" may produce a deadlock. "NotTested" remains active until a system component has been subjected to a predefined test. If this test is not performed for reasons not known in greater detail, the component remains inhibited. The inhibit relation is set at the start of driving. If all other inhibit relations are active (inhibited) in the cycle at this point, then a deadlock is unavoidable.
"Inhibit" with "Tested". An inhibit relation of the category "Tested" is reliably released at the beginning of driving. Thus, a possibly produced deadlock is reliably resolved by a component "Tested" at the start of each ride.

Influence variables acting on nodes:
DFC ("MultipleProviding") calculated by a plurality of FIDS. Such a DFC is calculated not only by the FID involved in the cycle, but by further FIDS in addition. Because the precise logic operation of the FIDs (AND/OR) in the deadlock search is not known and, furthermore, it is not known what contribution the FID makes to the calculation of the DFC, no (algorithmic) statement may be made as to whether a deadlock will be produced or whether a deadlock will be able to be resolved at this point.

DFC with "ResetAtIni" and subsequent "Defect" edge. Analogous to "tested", the DFC is reliably reset at the start of each drive at "ResetAtIni". However, has an effect only if the subsequent inhibit is a "Defect" edge.

On the basis of the mentioned influence variables, a deadlock class or criticality class is able to be determined. An influence variable will act on a cyclical inhibit relation when it occurs at least once in a particular cycle. For example, the influence variable "Tested" has an effect when at least one edge of the cycle includes the limit "Tested". The influence variable "ResetAtIni" is considered only at a "Defect" edge since the influence variable "ResetAtIni" will have an effect only in such a case. Provided a corresponding cycle has a length>1, "Defect" edges have no effect on the criticality class. A special case, which is considered further down, results at cycles having length 1.

| Edges | | Nodes | | Criticality Class (Deadlock Class) | | | |
|---|---|---|---|---|---|---|---|
| Not Tested | Tested | Multiple Providing | mit Defect-Kante | Hard | Potential | Temporary | Simple Cycle |
| 0 | 0 | 0 | 0 | | | | 1 |
| 0 | 0 | 0 | 1 | | | | 1 |
| 0 | 0 | 1 | 0 | | 1 | | |
| 0 | 0 | 1 | 1 | | | 1 | |
| 0 | 1 | 0 | 0 | | | | 1 |
| 0 | 1 | 0 | 1 | | | | 1 |
| 0 | 1 | 1 | 0 | | | 1 | |
| 0 | 1 | 1 | 1 | | | 1 | |
| 1 | 0 | 0 | 0 | 1 | | | |
| 1 | 0 | 0 | 1 | | | 1 | |
| 1 | 0 | 1 | 0 | | 1 | | |
| 1 | 0 | 1 | 1 | | | 1 | |
| 1 | 1 | 0 | 0 | | | | 1 |
| 1 | 1 | 0 | 1 | | | | 1 |
| 1 | 1 | 1 | 0 | | | | 0 |
| 1 | 1 | 1 | 1 | | | 1 | |

According to example embodiments of the present invention, in order to provide a uniform basis for determining deadlock or criticality classes, the node properties are transferred to the associated edge properties. Accordingly, only the properties of corresponding edges will then be relevant for the assessment. An edge "inherits" the properties of the base node, i.e., if the DFC or the node from which the edge originates has the attribute "MultipleProviding", then an edge has the attribute "MultipleProviding".

The following edge properties are able to be differentiated on this basis:
NotTested
Tested
MultipleProviding
ResetAtIni
ResetAtIniMultipleProviding
NotTestedMultipleProviding
Tested MultipleProviding According to example embodiments, a finite state machine may be used for determining the criticality class into which a cycle falls. The finite state machine has a number of states that corresponds to the number of criticality classes. The finite state machine also has an initial state and is used for traversing a corresponding cycle. Depending on the attributes of the edges, as shown above, a state is, or is not, changed when traversing edges. The state in which the automaton happens to be after traversing the cycle (final state) indicates the class of the cycle.

Figure 2:
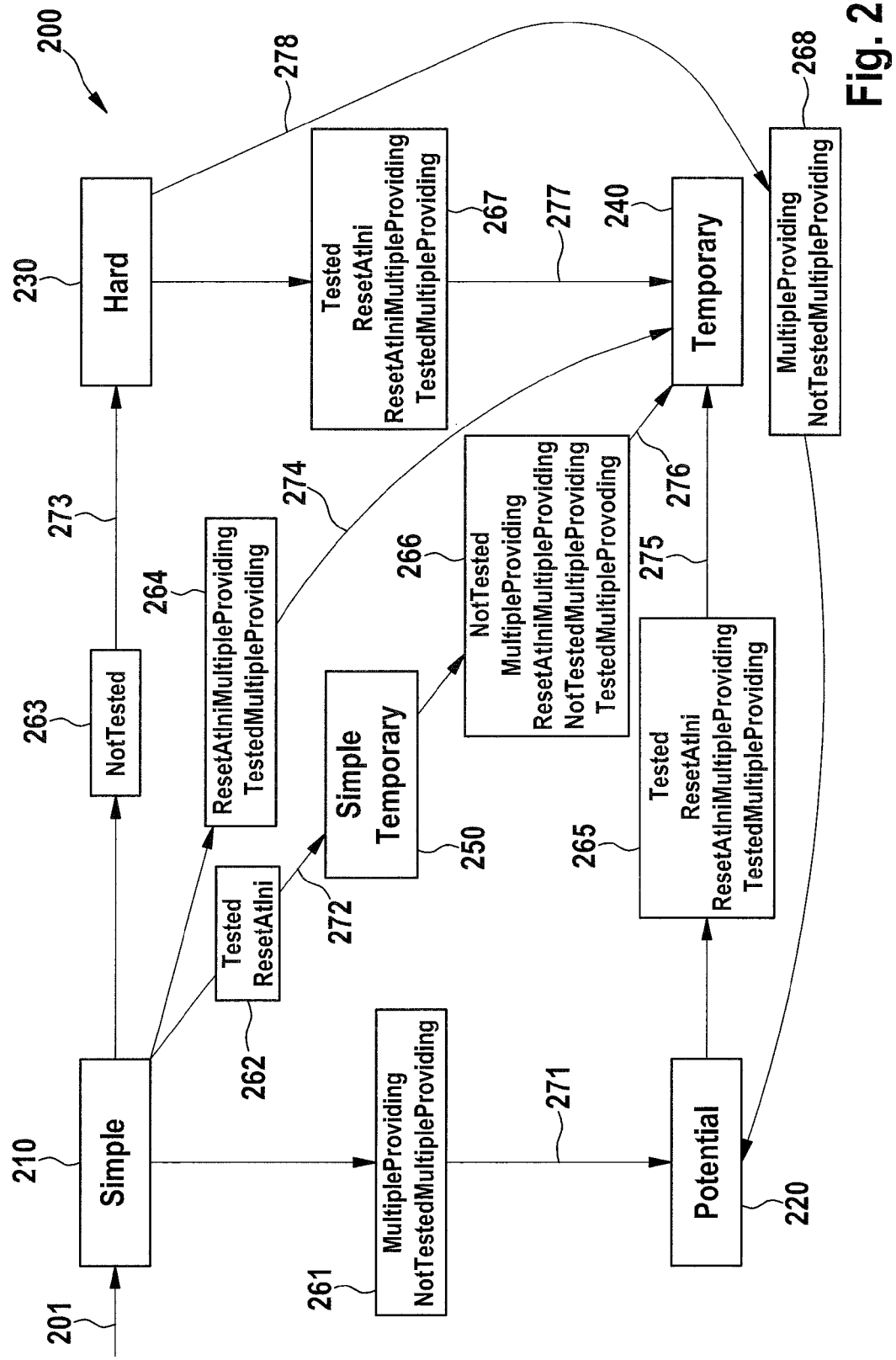
FIG. 2 is a schematic representation of the method of functioning of a finite state machine according an example embodiment of the present invention.

FIG. 2 shows a flow schematic, which describes the function of a finite state machine according to an example embodiment of the present invention. The schema is denoted by 200 over all. A finite state machine is in its basic state at start 201. FIG. 2, over all, shows the five criticality classes "Simple" 210, "Potential" 220, "SimpleTemporary" 250, "Hard" 230, and "Temporary" 240. Furthermore, FIG. 2 shows edge properties 261 through 268, which correspond to edges that the finite state machine traverses (symbolized by sequence arrows 271 through 278. As can be gathered from FIG. 2, the finite state machine changes from the state "Simple" 210 to the state "Potential" 220 when it traverses edge "MultipleProviding" or "NotTestedMultipleProviding" 261, for example. State transitions that are shown in the figure and which correspond to other edge properties 262 through 268 are not shown for reasons of clarity, but can be gathered directly from the figure nevertheless. The state "SimpleTemporary" is an auxiliary state which is part of the class "Simple". This auxiliary state is required in order to store whether a "Tested" or a "ResetAtIni" edge has already been traversed. Nevertheless, the auxiliary state is part of the class "Simple".

A special case, as mentioned, results in cycles having length 1. In that case a node or a corresponding DFC inhibits itself via an associated FID. The "Defect" edges are relevant as well in such a case. An assignment to the individual criticality classes results from the following table:

| Edges | Nodes | | Criticality Class | | | |
|---|---|---|---|---|---|---|
| | Multiple Providing | Reset AtIni | Hard | Potential | Temporary | Simple Cycle |
| Defect | 0 | 0 | 1 | | | |
| | 0 | 1 | | | 1 | |
| | 1 | 0 | | 1 | | |
| | 1 | 1 | | | 1 | |
| Tested | 0 | X | | | | 1 |
| | 1 | X | | | | |
| Not Tested | 0 | X | 1 | | | |
| | 1 | X | | | 1 | |

Cycles having length 1 may be taken into account by two alternatives. Either certain states may be assigned to other criticality classes through an expanded rule for cycles having length 1, namely the state "Simple" to criticality class "Hard", and the state "SimpleTemporary" to criticality class "Temporary". Since the used algorithm searches for shortest paths, a self inhibit will be found as soon as it exists. Only in the event that a plurality of self-inhibit paths exists for one DFC will self-inhibits not be found. However, this is true only in exceptional cases. As an alternative, using a separate rule, a search proceeding from each DFC may be conducted to ascertain whether a cycle having length 1 exists. If this is true, then it is evaluated in accordance with the table. This advantageously makes it possible to find all self-inhibits. However, there is the disadvantage of having to set up two different algorithms for this alternative.

Figure 3:
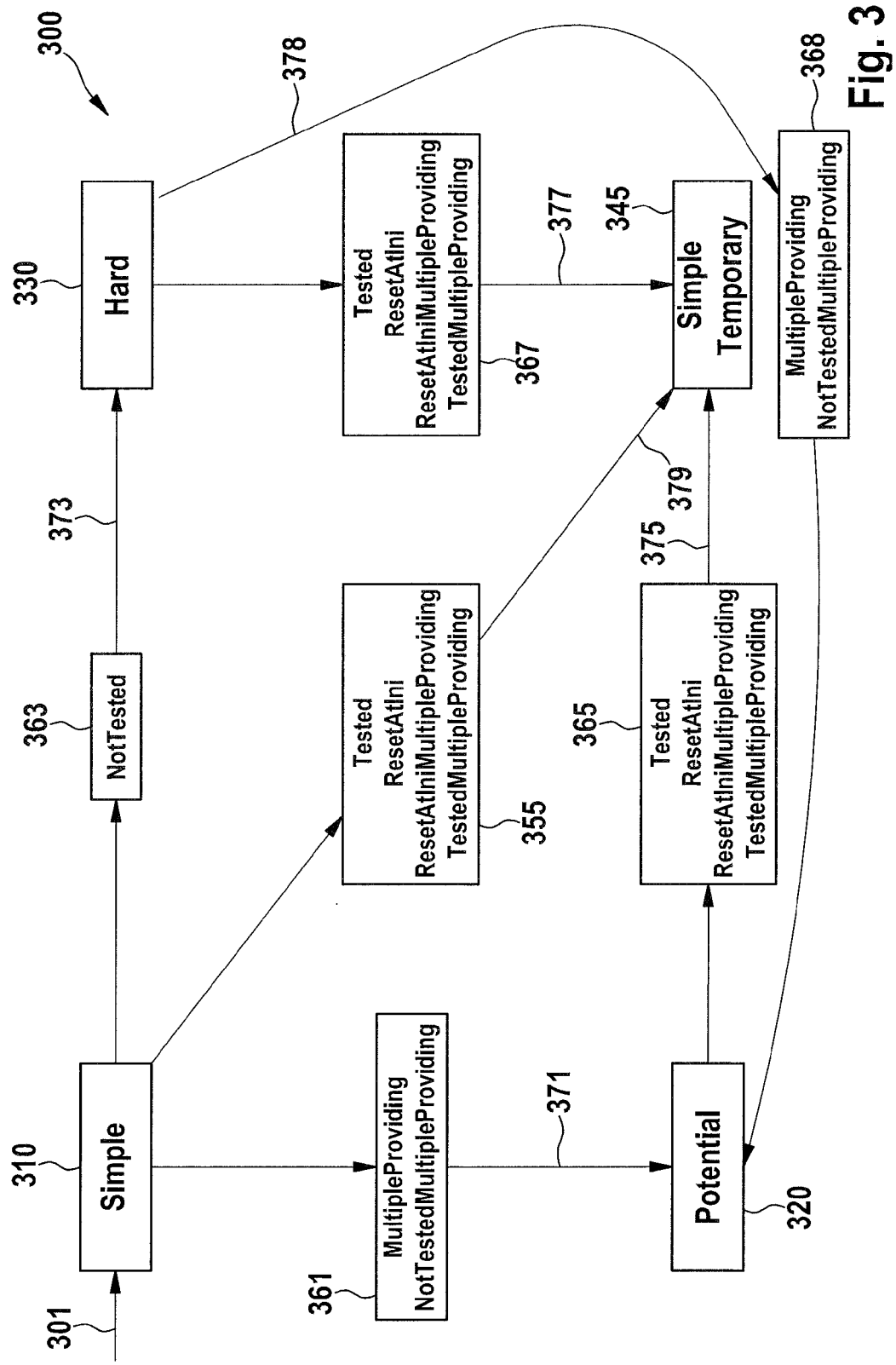
FIG. 3 is a schematic representation of the method of functioning of a finite state machine according to an example embodiment of the present invention.

As mentioned earlier, the criticality class "Temporary" is of lower relevance. As a result, no differentiation between "Temporary" and "Simple" is required within the framework of the method according to example embodiments of the present invention. The previously elucidated finite state machine may consequently be simplified. A finite state machine simplified in this manner is shown in FIG. 3 and denoted by 300 over all. Elements that correspond to the finite state machine from FIG. 2 are indicated by reference numerals incremented by 100 and hereinafter not discussed any further. In summary, finite state machine 300 may be characterized by the fact that the states "Simple Temporary" and "Temporary" "fuse" into a single state 345. In this state 345 it is then no longer known whether an inhibit relation belongs to one of the classes "Simple" or "Temporary". However, as mentioned, this is not necessary because this inhibit relation may be considered less critical. The state "Simple" is maintained and may continue to be output as "Hard" at cycles having length 1, as mentioned. From the finite state machine of FIG. 3 it can be gathered that, as soon as an influence variable that is reset at the beginning of the ride ("Tested", "ResetAtIni") is present, a change to state "Simple Temporary" takes place. Furthermore, the edge properties "MultipleProviding" and "NotTested", "MultipleProviding" are able to be combined, as indicated by 355 and 379.

Three transition conditions result from this and the associated edge properties shown in the following table:

| Transition Condition | Edge Property |
| --- | --- |
| Temporary | Tested |
|  | ResetAtIni |
|  | ResetAtIniMultipleProviding |
|  | TestedMultipleProviding |
| Potential | MultipleProviding |
|  | NotTestedMultipleProviding |
| Hard | NotTested |

Figure 4:
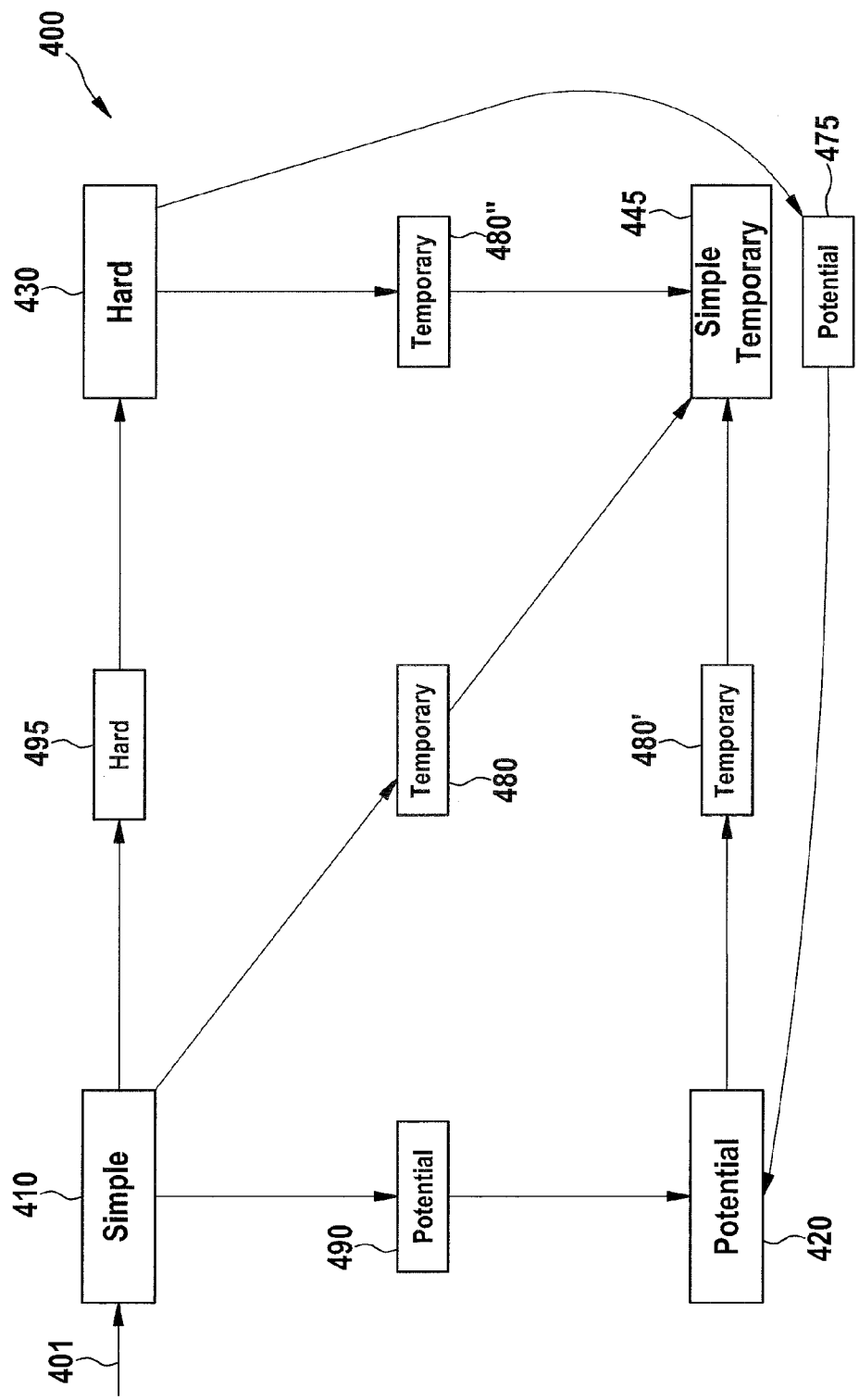
FIG. 4 is a schematic representation of the method of functioning of a finite state machine according to an example embodiment of the present invention.

A resulting finite state machine, which is simplified still further, is shown in FIG. 3 and denoted by 400 over all. Elements corresponding to the elements of FIG. 3 are indicated by reference numerals that have been incremented by 100. The finite state machine of FIG. 4 outputs deadlocks in the state "Hard" or "Potential." In addition, "Simple" deadlocks having length 1 are output as "Hard" deadlocks. Only the transitions "Potential" 475, 490, "Hard" 495, and "Temporary" 480, 480', 480" still remain in finite state machine 400.

Figures 5A, 5B, 6A:
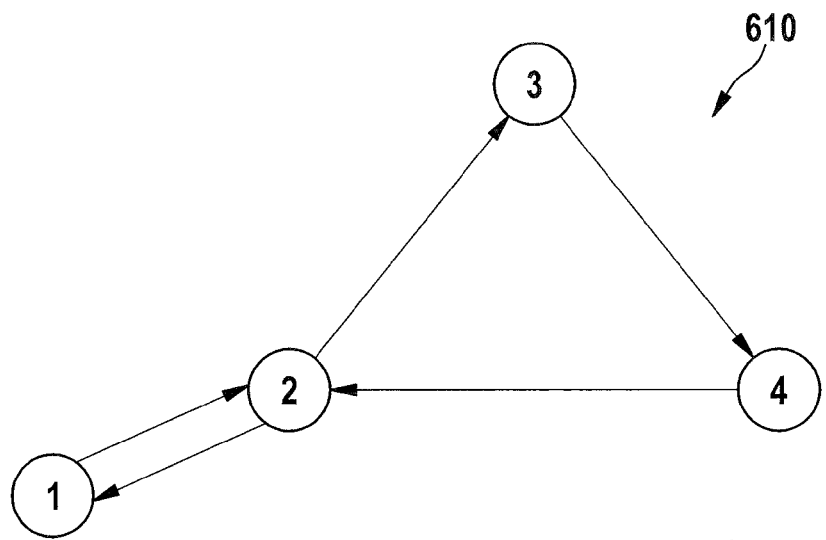
FIG. 5A illustrates a transition between two nodes of a graph according to an example embodiment of the present invention.
FIG. 5B illustrates a transition between two nodes of a graph according to an example embodiment of the present invention.
FIG. 6A is a schematically simplified graph to elucidate the method carried out according to an example embodiment of the present invention.

FIGS. 5A and 5B illustrate the assignment of n-tupels to nodes. Transitions between tupel elements are shown as well. In FIGS. 5A and 5B, n corresponds to the number of the previously explained criticality stages, the tupel elements corresponding to the criticality stages "Simple", "Simple Temporary", "Hard" and "Potential". Expressed in other terms, the tupels may be indicated as ("Simple", "Simple Temporary", "Hard", "Potential") in each case. The individual connections between two DFCs (DFC_1 and DFC_2) are illustrated.

In FIG. 5A, the edge connecting DFC_1 and DFC_2 does not lead to any state transition. Thus, only connections between tupel elements of the same criticality stage are present. In FIG. 5B, in contrast, there is an edge that leads to a state transition from "Simple" to "Hard". Thus, the graph level is changed by the state transition, so to speak. There is a connection of tupel elements featuring different criticality stages.

FIG. 6A shows a simple graph 610 made up of nodes 1, 2, 3, and 4, with whose aid a method which is taking place according to an example embodiment of the present invention will now be explained by way of example. Graph 610 has cycles 1-2-1 and 2-3-4-2 (simple cycles), as well as a so-called "eight" cycle 1-2-3-4-2-1. Such eight-cycles are cycles in which a particular node occurs multiple times. In the following text it will be examined whether instances exist in which the mentioned simple cycles are uncritical, whereas the eight-cycle is critical. Furthermore, the way in which such an eight-cycle is treated according to the method described herein will be checked.

A deadlock is active only when all inhibit relations in such a cycle are active. Thus, a deadlock also exists in an eight-cycle when all inhibit relations are active in the eight-cycle. From this it follows that all inhibit relations must be active even in the simple cycles, and a deadlock must therefore exist in the cycles as well. As a result, an eight-cycle is critical only if the simple cycles are critical too. An algorithm that searches for shortest paths, as it is used within the present framework, does not discover any eight-cycles since a shorter path invariably exists in these cases (i.e., the particular simple cycle). If a node is split into tupels according to example embodiments of the present invention, a node is split into four elements, so that the "equality" of the four elements is lost.

Figure 6B:
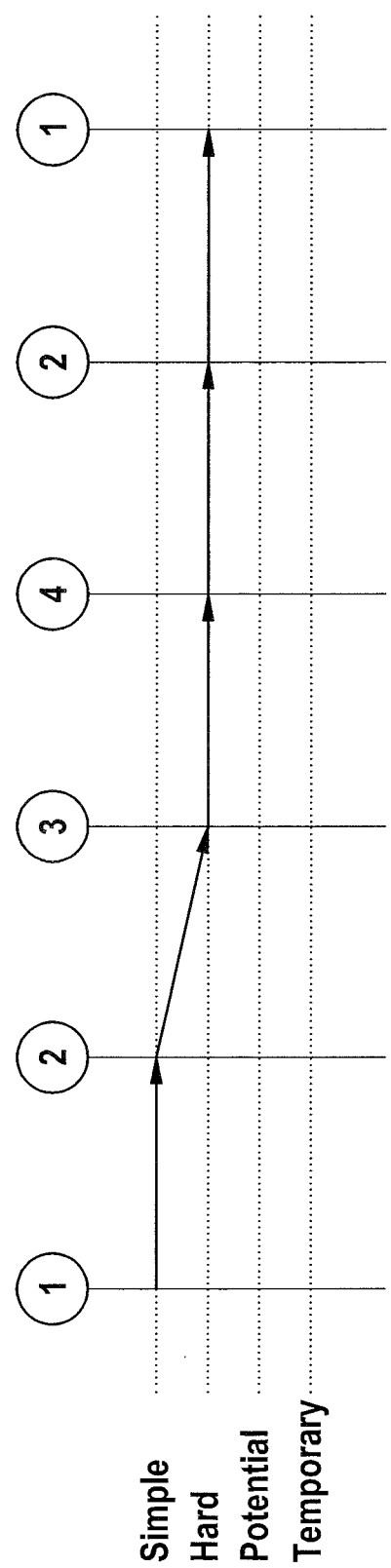
FIG. 6B is a schematic diagram to elucidate a method carried out according to an example embodiment of the present invention.

In graph 610, edge 2-3 is to be a "NotTested" edge, and all other edges are to be "Defect" edges. In FIG. 6B, a path from node 1 ("Simple") to node 1 ("Hard"), i.e., a cycle 1-2-3-4-2-1 analogous to the illustration in FIGS. 5A and 5B is shown. This path will be found by an algorithm searching for shortest paths since this is the only manner that leads from tupel element 1 ("Simple") to 1 ("Hard") and this fact is exploited within the framework of the prioritization according to example embodiments of the present invention. The information that node 2 is run through twice is lost because the path extends via different tupel elements of node 2. Critical cycle 2-3-4-2 is also found by the algorithm. However, an eight-cycle 1-2-3-4-2-1 is found in addition. Eight-cycles must therefore be filtered out retroactively. Cycle 1-2-1 is not found because no transition having a prioritizing effect is included here. Since it consists only of "Defect" edges, however, it is also not critical.

The method according to an example embodiment of the present invention is summarized once again using different words.

First of all, properties ("ResetAtIni", "MultipleProviding") are determined for the nodes. On the basis of the properties of the nodes and the edges connecting them and likewise to be determined, the edges are classified.

In a next step, FIDs are eliminated since they function only as an "extension" of paths. For inhibit relations acting on an FID are mapped to the DFCs located downstream, which are calculated by this FID. However, the FID name may be stored in an edge property so that it, too, may be output when outputting a deadlock report.

In a next step, a data structure for a deadlock search is set up. Each node in the graph is mapped to a tupel, e.g., a 4-tupel. Each 4-tupel has tupel elements that correspond to the four states of a finite state machine ("Simple", "Simple Temporary", "Hard", "Potential").

For each element of the tupel, an edge is inserted between two nodes in a graph. If an edge leads to a state transition in an automaton, then it leads to the corresponding tupel element in the graph. Otherwise, the edge leads to the same tupel element in the target node.

In the graph set up in this manner a search for the shortest paths or cycles is then conducted. Per node three paths are relevant in this context:

1. Level "Simple" to level "Simple" having length 1 (for identifying self-deadlocks)
2. Level "Simple" to level "Hard"
3. Level "Simple" to level "Potential".

These relevant paths are used within the framework of a prioritization, based on which only relevant cycles, or preferably only certain relevant cycles, are obtained subsequently. In the scheme of the previously elucidated FIGS. 5A and 5B, a search is therefore carried out for the following paths:

1. DFC_1 [Simple]→DFC_1 [Simple] and length 1 (self-deadlocks?)
2. DFC_1 [Simple]→DFC_1 [Hard]
3. DFC_1 [Simple]→DFC_1 [Potential]

In a next step, 8-cycles are eliminated, as previously explained.

Furthermore, in order to be able to identify the deadlocks discovered multiple times, the deadlocks must be "standardized". The starting node of a deadlock is the DFC that is the smallest DFC sorted alphabetically. All deadlocks having the same starting nodes are now able to be checked for parity.

In particular, the method according to example embodiments of the present invention has the following advantages:

Since the method does not search for all cycles but only for cycles having the shortest paths, not all of the deadlocks are identified. However, when a plurality of cycles exists for one node, the split-up of the nodes into tupels will ensure that one cycle from the most critical class will reliably be discovered. In case of deadlocks of the "Hard" class, this makes it possible to resolve them successively by removing the discovered deadlock and subsequently starting the search anew. Deadlocks of the "Potential" class are able to be removed successively only until a classification as irrelevant takes place.

If at least one node exists for each deadlock, which node is included in only this particular deadlock, all deadlocks will be found. It is considered especially advantageous that the method is able to be optimized by reducing a data quantity to be searched, for example, since it removes all nodes that cannot be involved in any cycle, for instance because they include only input or only output edges.

In addition, algorithms having a lower run time such as the Weinblatt algorithm may be used.

Compared to program states in algorithms according to certain conventional systems, the algorithm according to example embodiments of the present should provide a run time of less than 90 seconds, whereas certain conventional algorithms should require several days, e.g., at least 100 hours.

What is claimed is:

1. A method for determining deadlock-critical relations between networked components of a vehicle system, in which a graph is used that at least partially represents the deadlock-critical relations defined in the vehicle system and has nodes and edges, the method comprising:

classifying at least a portion of the edges based on properties of the edges and the nodes that are connected by the edges;
prioritizing the edges based on the classification; and
determining a shortest one of deadlock-critical cycles for all nodes and at least a few edges based on the prioritization.

2. The method according to claim 1, wherein the classification is made based on criticality properties of the nodes and the edges.

3. The method according to claim 1, wherein only components involved in at least one cycle are represented by the graph.

4. The method according to claim 1, wherein a finite state machine having a number of states is used, and wherein traversing of edges having a specific classification causes a state transition.

5. The method according to claim 4, wherein the cycles are traversed by the finite state machine and an assessing of the deadlock-critical relations is performed on the basis of a final state of the finite state machine.

6. The method according to claim 1, wherein a number of linking points corresponding to different criticality classes is assigned to at least a portion of the nodes.

7. The method according to claim 6, wherein the linking points of different nodes, connected by the edges, of identical or different criticality classes are connected by connections.

8. The method according to claim 7, wherein shortest cycles that have edges which connect linking points of different criticality classes are determined on the basis of the connections.

9. The method according to claim 6, wherein the linking points are defined in the form of n-tupels, n corresponding to a number of criticality classes.

10. The method according to claim 1, wherein the classification is made based on criticality properties of the nodes and the edges, and wherein only components involved in at least one cycle are represented by the graph.

11. The method according to claim 10, wherein a finite state machine having a number of states is used, wherein traversing of edges having a specific classification causes a state transition, and wherein the cycles are traversed by the finite state machine and an assessing of the deadlock-critical relations is performed on the basis of a final state of the finite state machine.

12. The method according to claim 11, wherein a number of linking points corresponding to different criticality classes is assigned to at least a portion of the nodes, and wherein the linking points of different nodes, connected by the edges, of identical or different criticality classes are connected by connections.

13. The method according to claim 12, wherein shortest cycles that have edges which connect linking points of different criticality classes are determined on the basis of the connections.

14. The method according to claim 13, wherein the linking points are defined in the form of n-tupels, n corresponding to a number of criticality classes.

15. The method according to claim 12, wherein the linking points are defined in the form of n-tupels, n corresponding to a number of criticality classes.

16. The method according to claim 11, wherein shortest cycles that have edges which connect linking points of different criticality classes are determined on the basis of the connections.

17. A device configured to determine deadlock-critical relations between networked components of a vehicle system, the device comprising:
- hardware components of the vehicle including an arrangement adapted to determine the deadlock-critical relations between networked components of the vehicle system, in which a graph is used that at least partially represents the deadlock-critical relations defined in the vehicle system and has nodes and edges, by performing the following:
    - classifying at least a portion of the edges based on properties of the edges and the nodes that are connected by the edges;
    - prioritizing the edges based on the classification; and
    - determining a shortest one of deadlock-critical cycles for all nodes and at least a few edges based on the prioritization.

* * * * *